(12) United States Patent  
Michiue

(10) Patent No.: US 10,879,422 B2  
(45) Date of Patent: Dec. 29, 2020

(54) LIGHT EMITTING ELEMENT

(71) Applicant: NICHIA CORPORATION, Anan-shi, Tokushima (JP)

(72) Inventor: Atsuo Michiue, Anan (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 16/337,851

(22) PCT Filed: Sep. 27, 2017

(86) PCT No.: PCT/JP2017/034908  
§ 371 (c)(1),  
(2) Date: Mar. 28, 2019

(87) PCT Pub. No.: WO2018/062252  
PCT Pub. Date: Apr. 5, 2018

(65) Prior Publication Data  
US 2020/0035860 A1    Jan. 30, 2020

(30) Foreign Application Priority Data  
Sep. 29, 2016 (JP) ................. 2016-192031

(51) Int. Cl.  
*H01L 33/18* (2010.01)  
*H01L 33/14* (2010.01)  
(Continued)

(52) U.S. Cl.  
CPC ............ *H01L 33/145* (2013.01); *H01L 33/06* (2013.01); *H01L 33/16* (2013.01); *H01L 33/24* (2013.01); *H01L 33/32* (2013.01)

(58) Field of Classification Search  
CPC ...................................... H01L 33/18  
See application file for complete search history.

(56) References Cited

U.S. PATENT DOCUMENTS

2011/0169025 A1   7/2011  Kishino et al.  
2013/0187128 A1*  7/2013  Yi ........................ H01L 33/24  
                                                      257/13  
(Continued)

FOREIGN PATENT DOCUMENTS

JP    2009-147271 A    7/2009  
JP    2013-004661 A    1/2013  
(Continued)

OTHER PUBLICATIONS

Ledig, et. al., "Characterization of the internal properties of InGaN/GaN core-shell LEDs," Phys. Status Solidi A 213, No. 1, 11-18 (2016).

(Continued)

*Primary Examiner* — Peniel M Gumedzoe  
*Assistant Examiner* — Christopher A Johnson  
(74) *Attorney, Agent, or Firm* — Foley & Lardner LLP

(57) ABSTRACT

A light emitting element includes: a first conductivity type semiconductor rod having a plurality of side surfaces arranged to form a polygonal column shape; an active layer formed of a semiconductor and covering the side surfaces; and a second conductive type semiconductor layer covering the active layer. The active layer includes a plurality of well layers respectively disposed over at least two adjacent side surfaces among the plurality of side surfaces. Adjacent well layers among the plurality of well layers are separated from each other along a ridge line where the at least two adjacent side surfaces are in contact with each other. The active layer further includes a ridge portion formed of a semiconductor and disposed on the ridge line, the ridge portion connecting the adjacent well layers. A bandgap of the ridge portion is wider than a bandgap of each of the plurality of well layers.

16 Claims, 10 Drawing Sheets

(51) Int. Cl.
  *H01L 33/06* (2010.01)
  *H01L 33/16* (2010.01)
  *H01L 33/24* (2010.01)
  *H01L 33/32* (2010.01)

(56) References Cited

U.S. PATENT DOCUMENTS

2015/0021636 A1   1/2015  Mandl et al.
2015/0214429 A1   7/2015  Iizuka et al.
2016/0087150 A1   3/2016  Ristic et al.

FOREIGN PATENT DOCUMENTS

| JP | 2015-508941 A | 3/2015 |
| JP | 2015-142020 A | 8/2015 |
| JP | 2016-521459 A | 7/2016 |
| WO | WO-2010/023921 A1 | 1/2012 |
| WO | WO-2015/095049 A1 | 6/2015 |

OTHER PUBLICATIONS

International Search Report for PCT/JP2017/034908 dated Dec. 19, 2017.

\* cited by examiner

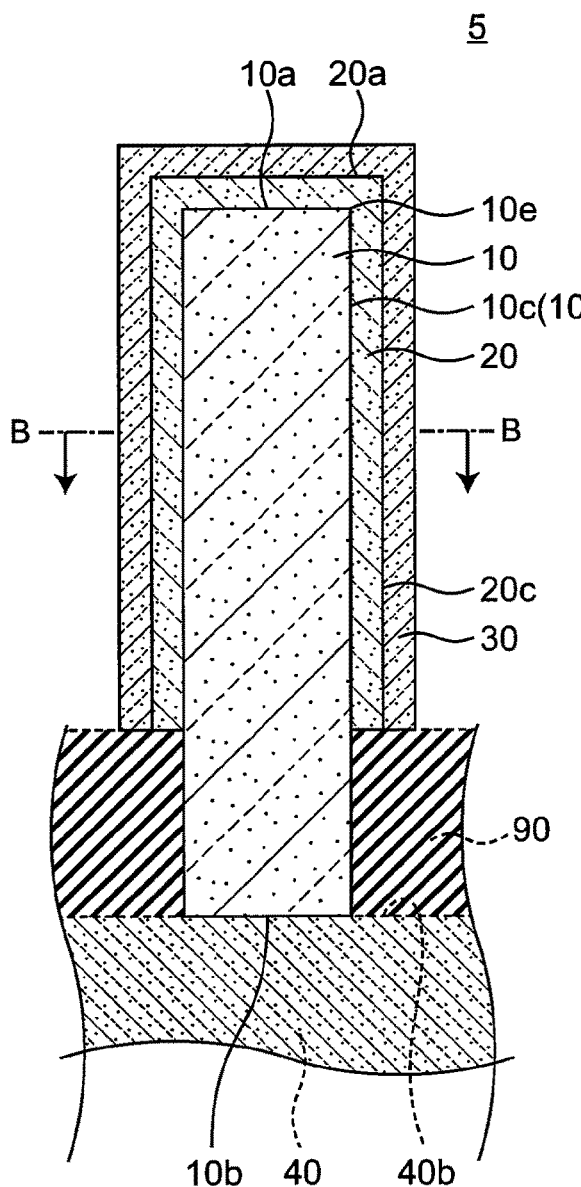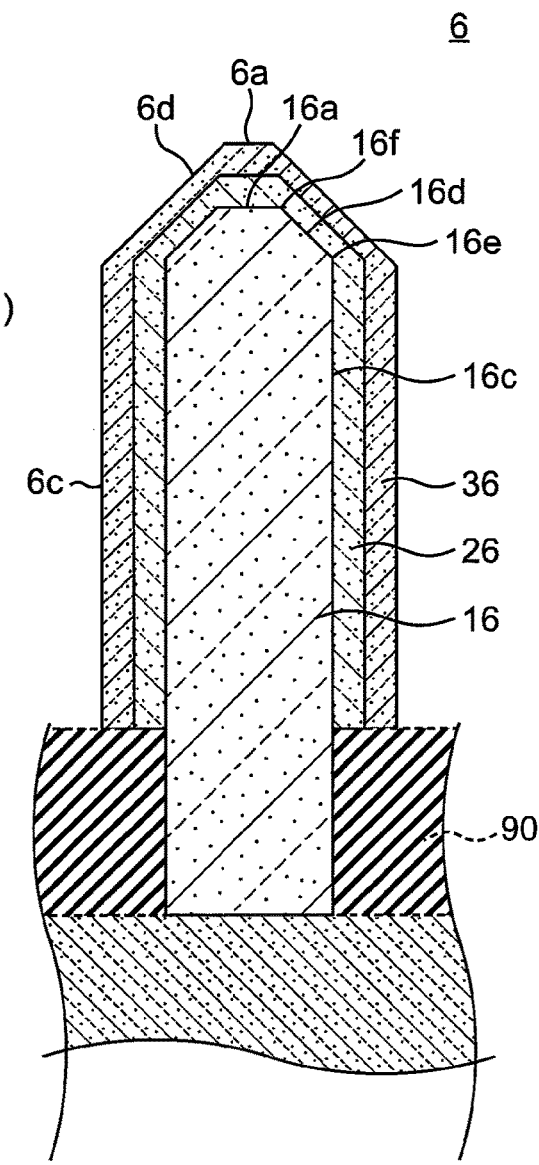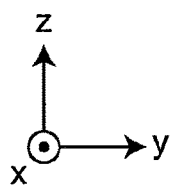

LIGHT EMITTING ELEMENT

This application is a national stage application of PCT Application No. PCT/JP2017/034908, filed on Sep. 27, 2017, which claims priority to Japanese Patent Application No. 2016-192031, filed on Sep. 29, 2016, the disclosures of which are incorporated by reference in their entireties.

BACKGROUND

The present disclosure relates to a light emitting element.

In recent years, rod-shaped light emitting elements including rod-shaped structures have attracted attention (see, for example, JP 2013-004661 A, JP 2015-142020 A, and JP 2015-508941. A rod-shaped light emitting element includes one or more semiconductor rods, each made of a first conductivity type semiconductor (for example, an n-type semiconductor), an active layer covering a surface of the rod, and a second conductivity type semiconductor layer (for example, a p-type semiconductor layer) covering the active layer.

The rod-shaped light emitting element has an advantage that it can have a wide light emitting area per unit volume, compared to a conventional light emitting element, because the entire surface of its semiconductor rod can serve as a light emitting surface.

SUMMARY

The typical rod-shaped light emitting element has one or more cylindrical or polygonal columnar rod-shaped structures having a thickness of 20 nm to 3 μm and a length of 100 nm to 100 μm. The light emitting element having such a rod-shaped structure is not yet sufficiently high in luminous efficiency.

Accordingly, it is an object of the present disclosure to provide a rod-shaped light emitting element that can have enhanced luminous efficiency.

A light emitting element according to the present disclosure includes: a first conductivity type semiconductor rod having a plurality of side surfaces arranged to form side surfaces of a polygonal column; an active layer formed of a semiconductor and covering the side surfaces of the first conductivity type semiconductor rod; and a second conductive type semiconductor layer covering the active layer, wherein the active layer includes a plurality of well layers respectively disposed over at least two adjacent side surfaces among the plurality of side surfaces, the adjacent well layers among the plurality of well layers are separated from each other along a ridge line where the adjacent side surfaces are in contact with each other, the active layer further includes a ridge portion formed of a semiconductor and disposed on the ridge line, the ridge portion connecting the adjacent well layers, and a bandgap of the ridge portion is wider than a bandgap of each of the plurality of well layers.

According to the light emitting element of the present disclosure, the luminous efficiency of the rod-shaped light emitting element can be enhanced.

BRIEF DESCRIPTION OF THE DRAWINGS

FIG. 3A is a partially enlarged view of a cross section of a rod-shaped light emitting portion shown in FIG. 2, and FIG. 3B is a partially enlarged view of a modified example of the rod-shaped light emitting portion.

DETAILED DESCRIPTION

Figure 1:
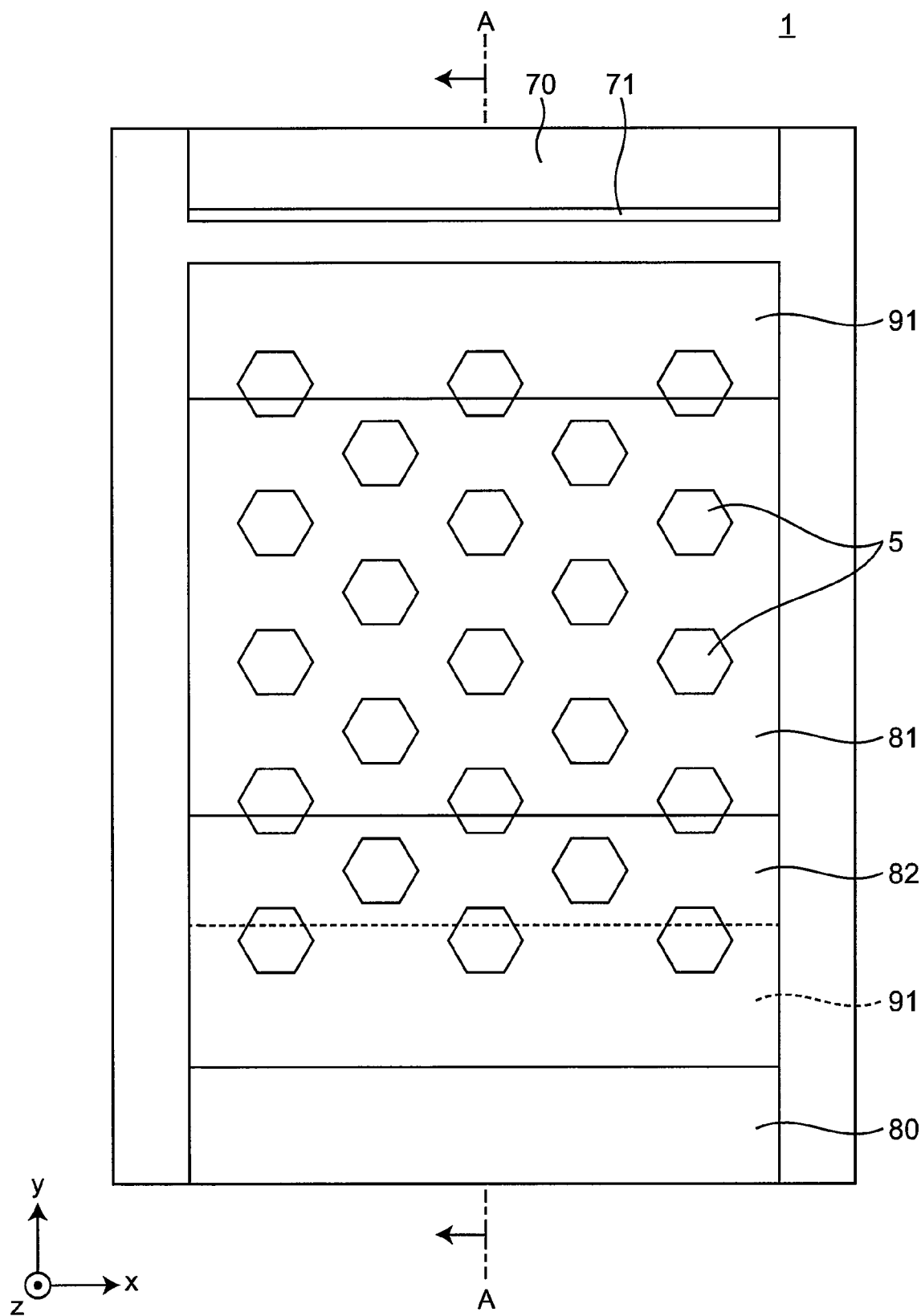
FIG. 1 is a schematic top view of a light emitting element according to an embodiment of the present disclosure.

A light emitting element of the present disclosure includes a first conductivity type semiconductor rod, an active layer covering side surfaces of the semiconductor rod, and a second conductive type semiconductor layer covering the active layer. The semiconductor rod has a plurality of side surfaces arranged to form side surfaces of a polygonal column. The active layer formed of a semiconductor includes a plurality of well layers provided over the side surfaces of the semiconductor rod and ridge portions provided on ridge lines of the semiconductor rod. The adjacent well layers are separated from each other by the corresponding ridge portion, and a bandgap of the ridge portion is wider than the bandgap of the well layer. Thus, carriers are less likely to move between the adjacent well layers, leading to improvement of the confinement effect of carriers in the well layers. Consequently, the luminous efficiency of the light emitting element can be enhanced.

Embodiments of the present invention will be described in detail below with reference to the accompanying drawings. In the description below, terms indicative of specific directions or positions (e.g., "upper", "lower", "right", "left", and other words including these words) are used as appropriate. These terms are used to make the present invention understood easily with reference to the drawings and do not limit the technical range of the present invention by their meanings. The same reference characters represented in the drawings indicate the same parts or members.

Figure 2:
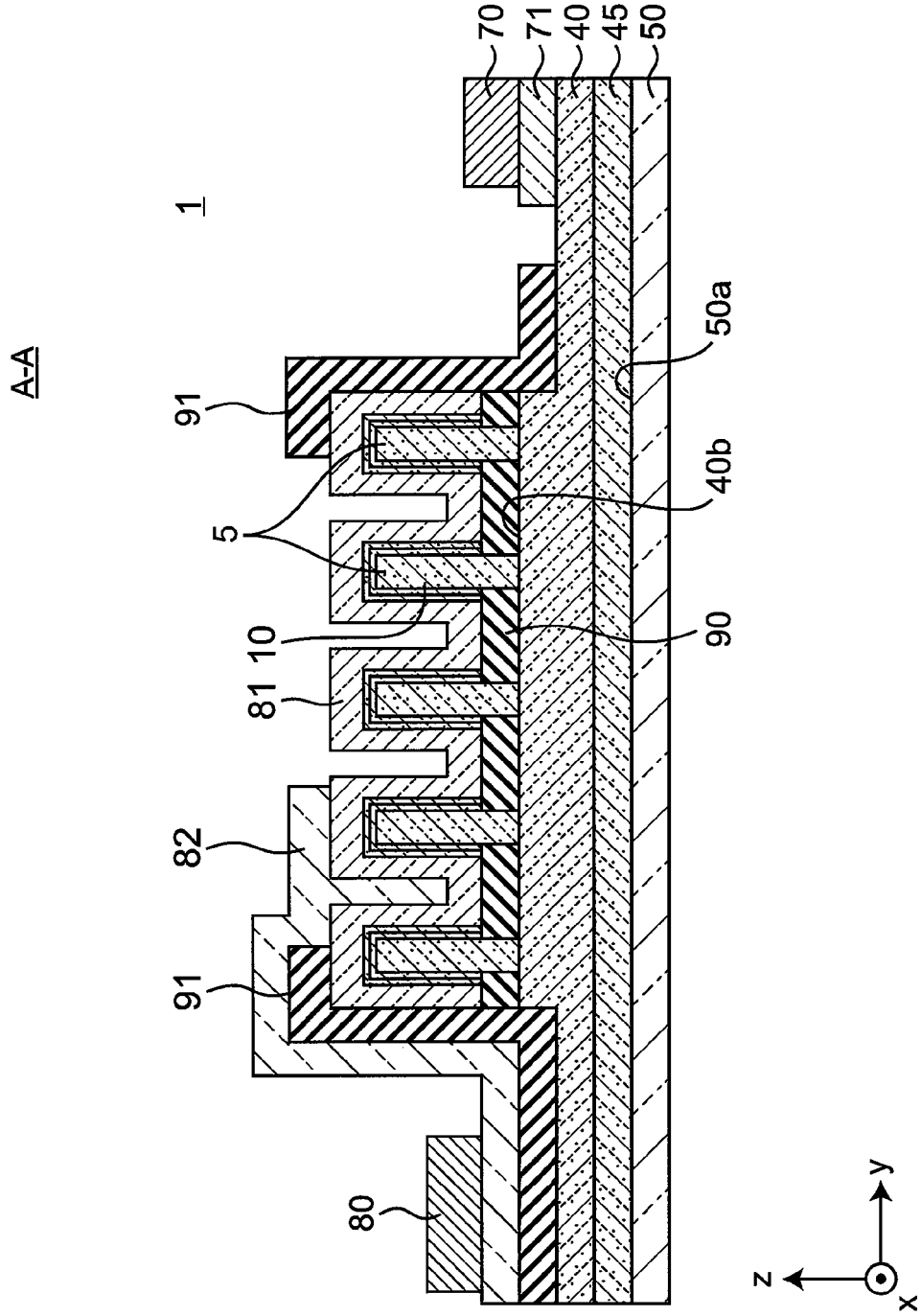
FIG. 2 is a schematic cross-sectional view taken along the line A-A of FIG. 1.

FIG. 1 is a schematic top view of a light emitting element 1 according to an embodiment of the present disclosure, and FIG. 2 is a schematic cross-sectional view of the light emitting element 1, taken along the line A-A of FIG. 1. As shown in FIGS. 1 and 2, the light emitting element 1 according to the embodiment includes a growth substrate 50, a buffer layer 45, a base layer 40, insulating films 90 and 91, light emitting portions 5 each having a rod shape (hereinafter referred to as "rod-shaped light emitting portions 5"), and electrodes 70, 71, 80, 81, and 82.

The rod-shaped light emitting portion 5 has a columnar shape, and in the example of FIG. 1, a hexagonal columnar shape. The light emitting element 1 includes at least one rod-shaped light emitting portion 5. The light emitting element 1 in FIG. 1 includes 21 light emitting elements (3×7 pieces).

FIG. 3A is a partially enlarged view of a cross section of the rod-shaped light emitting portion 5 shown in FIG. 2. As shown in FIG. 3A, each individual rod-shaped light emitting portion 5 includes a first conductivity type semiconductor rod (a semiconductor rod 10), an active layer 20, and a second conductivity type semiconductor layer (a semiconductor layer 30).

The semiconductor rod 10 has part or all of side surfaces 10c thereof covered with the active layer 20. Specifically, some side surfaces 10c or all side surfaces 10c among the plurality of side surfaces 10c are covered with the active layer 20, and additionally, with regard to each side surface 10c covered with the active layer 20, a partial or whole region of such a side surface 10c is covered with the active layer 20. It should be noted that in the present embodiment, at least two adjacent side surfaces 10c (for example, side surfaces $10c_1$ and $10c_2$ shown in FIG. 4) must be covered with the continuous active layer 20. Therefore, the expression "some side surfaces 10c among the plurality of side surfaces 10c" as used herein includes at least two adjacent side surfaces 10c.

"The case where only the partial region of one side surface 10c is covered with the active layer 20" indicates, for example, the state shown in FIG. 3A. That is, as shown in FIG. 3A, the side surface 10c (for example, one side surface $10c_1$) of the semiconductor rod 10 may have a shape such that a part of the side surface 10c located on a lower surface 10b side is covered with the insulating film 90, while only the region of the side surface 10c exposed from the insulating film 90 is covered with the active layer 20. Specifically, the side surface 10c can have a shape such that when the total area of the region of the side surface 10c exposed from the insulating film 90 is assumed to be 100%, the active layer 20 covers a range of approximately 70 to 100% of the total area measured from an upper surface 10a side, while the active layer 20 does not cover a range of 30 to 0% of the total area measured from the lower surface 10b side. It should be noted that the term "range of approximately 70 to 100%" as used herein is defined on the assumption that the total area of the region of the side surface 10c exposed from the insulating film 90 is 100%, and does not mean the range of approximately 70 to 100% relative to the area of the entire side surface 10c. Suppose that, for example, 10% of the area of the entire side surface 10c is covered with the insulating film 90, whereas 90% of the area of the entire side surface 10c is exposed from the insulating film 90. In this case, the term "range of approximately 70 to 100%" as used above refers to approximately 63% (90%×70%) to 90% (90%×100%) of the area of the entire side surface 10c.

In the present disclosure, such a configuration can be obtained when the insulating film 90 is used to form the semiconductor rods 10 in a manufacturing method mentioned later.

In any sense, from the viewpoint of increasing the light emitting area, the area of the region covered with the active layer 20, which functions as a light emitting layer, is preferably increased. Specifically, in the first sense, the active layer 20 is preferably disposed on all of the side surfaces 10c. In the second sense, 100% of the region of the side surface 10c exposed from the insulating film 90 is preferably covered with the active layer 20. More preferably, both of these conditions are satisfied.

In addition, preferably, the thickness of the active layer 20 is substantially the same on all of the side surfaces of the rod-shaped light emitting portion 5. Likewise, preferably, the thickness of the semiconductor layer 30 is substantially the same across all of the side surfaces of the rod-shaped light emitting portion 5. Thus, a similar amount of light emission can be obtained from all of the side surfaces of the rod-shaped light emitting portion 5.

Furthermore, the upper surface 10a of the semiconductor rod 10 may be covered with the active layer 20. It is noted that the lower surface 10b of the semiconductor rod 10 is not covered with the active layer 20 and is thereby used as a current path to the semiconductor rod 10.

The active layer 20 is covered with the semiconductor layer 30. In the example of FIG. 3A, the active layer 20 is formed on the side surfaces 10c and the upper surface 10a of the semiconductor rod 10, and the semiconductor layer 30 is provided to cover side surfaces 20c and an upper surface 20a of the active layer 20.

Figure 4:
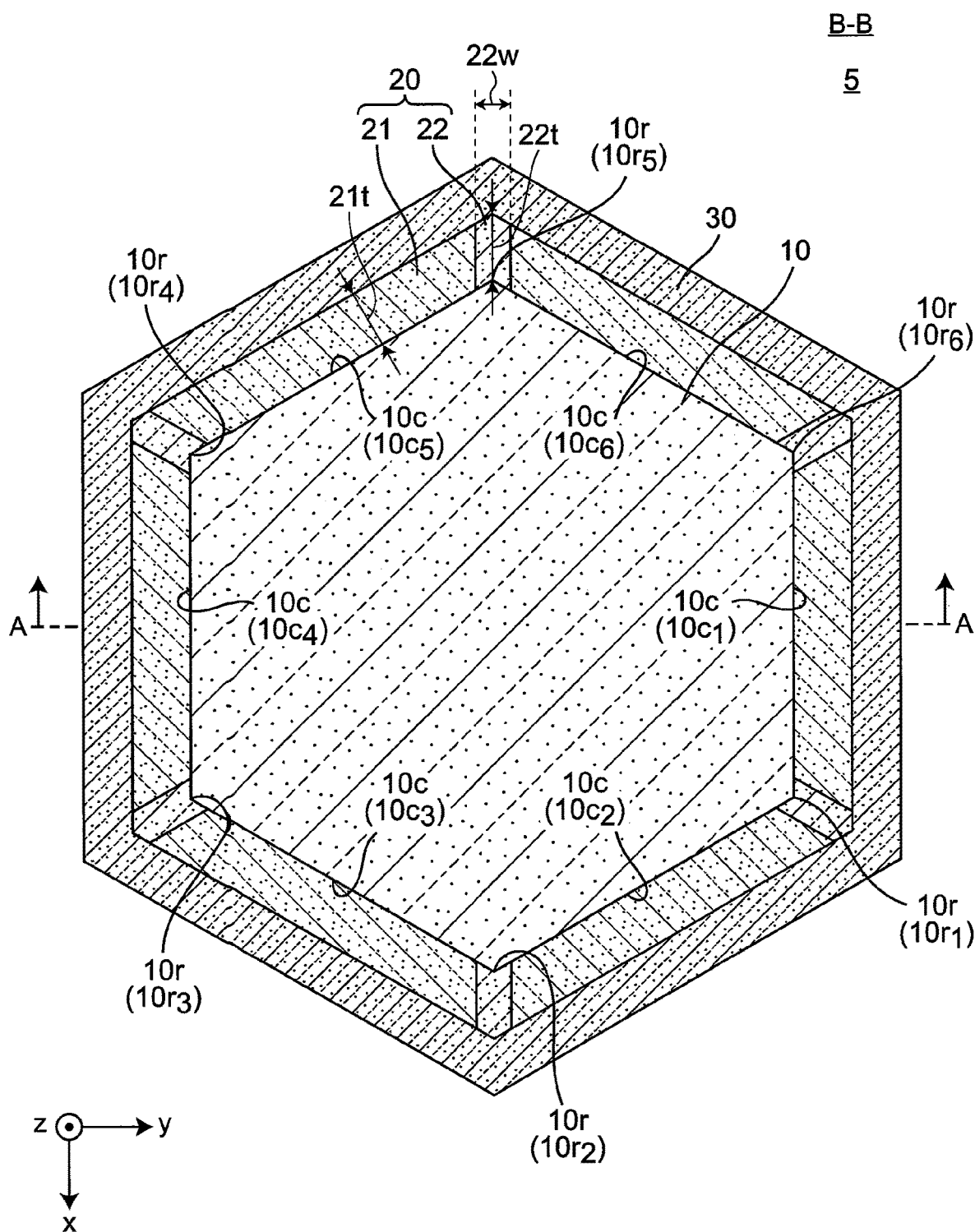
FIG. 4 is an exemplary cross-sectional view taken along the line B-B of FIG. 3A.

FIG. 4 is a schematic cross-sectional view of the rod-shaped light emitting portion 5, taken along the line B-B of FIG. 3A. The semiconductor rod 10 has a hexagonal shape, in which six sides correspond to the side surfaces 10c (side surfaces $10c_1$ to $10c_6$) of the semiconductor rod 10, and six apexes correspond to ridge lines 10r ($10r_1$ to $10r_6$) of the semiconductor rod 10. The ridge line 10r is formed by the adjacent side surfaces 10c and extends in the longitudinal direction (az direction) of the semiconductor rod 10. For example, the ridge line $10\ r_1$ is formed by the side surface $10c_1$ and the side surface $10c_2$.

The active layer 20 continuously surrounds the entire outer periphery of the hexagonal semiconductor rod 10. The active layer 20 includes well layers 21 and ridge portions 22. The well layers 21 are disposed over the side surfaces 10c of the semiconductor rod 10. The two well layers 21 that respectively cover the two adjacent side surfaces 10c are separated at the position of the ridge line 10r in the semiconductor rod 10. That is, the well layers 21 are discontinuous in the outer circumferential direction of the semiconductor rod 10. The ridge portion 22 is provided between the two adjacent well layers 21, i.e., at the position of the ridge line 10r of the semiconductor rod 10. The two adjacent well layers 21 are connected by the ridge portion 22 therebetween to form the active layer 20 that is continuous in the outer circumferential direction of the semiconductor rod 10.

As mentioned above, because the ridge line 10r extends in the longitudinal direction (the z direction) of the semiconductor rod 10, the ridge portion 22 of the active layer 20 also extends in the longitudinal direction (the z direction) of the semiconductor rod 10, along the corresponding ridge line 10r.

The bandgap of the ridge portion 22 is wider than the bandgap of the well layer 21. That is, the ridge portion 22 exhibits the same function as a barrier layer of a quantum well structure. Thus, the luminous efficiency of the rod-shaped light emitting portion 5 can be improved for the following reasons.

In the case of lighting up the rod-shaped light emitting portion 5, a voltage is applied to the light emitting element 1. Consequently, carriers are injected into the active layer 20, causing light emission. Here, the well layers 21 are separated from each other by the ridge portion 22 that has a large bandgap, whereby the carriers can be confined in the separated well layers 21 having a small dimension. Consequently, the frequency of occurrence of light emission recombination in the well layer 21 can be increased, thus making it possible to improve the luminous efficiency. When a distance between the adjacent ridge portions 22 is sufficiently small, for example, approximately several tens of nm, a quantum effect can be exhibited, thus enabling carriers to be more efficiently confined within the well layer 21.

Both the well layer 21 and the ridge portion 22 can be formed of a nitride semiconductor. For example, the well layer 21 is formed of InGaN, and the ridge portion 22 is formed of GaN or InGaN that has a smaller In composition ratio than the well layer 21. The bandgap between the well layer 21 and the ridge portion 22 can be controlled by the In content (In composition ratio) contained in the corresponding nitride semiconductor. For the nitride semiconductor, the higher the In composition ratio thereof, the narrower the bandgap thereof becomes, whereas the lower the In composition ratio thereof, the wider the bandgap thereof becomes. Thus, by setting the In composition ratio of the well layer 21 higher than the In composition ratio of the ridge portion 22, the bandgap of the ridge portion 22 can be made wider than the bandgap of the well layer 21.

In this case, when the In composition ratio of the well layer 21 becomes high, crystal strain in the nitride semiconductor that forms the well layer 21 would become larger, thus deteriorating its crystallinity. This deterioration might reduce the luminous efficiency thereof. In particular, when the volume of the well layer 21 becomes large, the crystal strain therein appears remarkable. However, in the present disclosure, the well layers 21 are separated from each other by the ridge portion 22 into a small volume. Thus, the strain of each well layer 21 is less likely to become apparent. In addition, the ridge portion 22 is formed of a nitride semiconductor that has a low In composition ratio or does not contain any In. Thus, the ridge portion 22 has little crystal strain therein and thereby acts to relax crystal strain in the well layer 21. That is, it is expected that the crystal strain that would be caused in the well layer 21 is reduced by a decrease in volume of each well layer 21 due to the separation of the well layers 21 at the ridge portion 22, which can improve the crystallinity of the well layer 21.

Such improvement of the crystallinity of the well layer 21 can enhance the efficiency of the light emitting element 1. In addition, because the crystallinity of the well layer 21 is improved by having the ridge portion 22, the In composition ratio of the well layer 21 can also be made high, as compared with the case where the ridge portion 22 is not present. When the In composition ratio of the well layer 21 is increased, light emission wavelength shifts to a longer wavelength, thus enabling the formation of the light emitting element 1 that emits light with the longer wavelength than in the related art. Consequently, light emitting elements having a wide range of emission wavelengths from red to ultraviolet rays can be formed by controlling the In composition ratio of the well layer 21 in a nitride-based semiconductor light emitting element in this way.

In the case in which a layer across a ridge line is provided on the side surface of a polygonal column, the thickness of the layer tends to be maximum at the ridge line. For example, as shown in FIG. 4, a film thickness 22$t$ of the ridge portion 22 at the ridge line 10$r$ is greater than a film thickness 21$t$ of the well layer 21 at the side surface 10$c$. If the well layer 21 is formed on the ridge line 10$r$ without providing any ridge portion 22, the well layer 21 becomes thicker at the ridge line 10$r$ than at other portions. The greater the film thickness of the well layer 21 is, the worse the crystallinity of the well layer 21 tends to be. Due to this, the provision of the well layer 21 on the ridge line 10$r$ may deteriorate the crystallinity of the well layer 21 at the ridge line 10$r$. By providing the ridge portion 22, such thickening of the well layer 21 at the ridge line 10$r$ can be avoided.

A specific method of making the bandgap of the ridge portion 22 wider than that of the well layer 21 includes forming both the well layers 21 and the ridge portions 22 from nitride semiconductors containing In such that the In composition ratio of the ridge portion 22 is lower than the In composition ratio of the well layer 21.

Another method includes forming the well layers 21 from a nitride semiconductor containing In and forming the ridge portions 22 from a nitride semiconductor not containing In. Specifically, the well layers 21 can be formed of InGaN, and the ridge portions 22 can be formed of GaN.

In either example, the bandgap of the ridge portion 22 can be made wider than the bandgap of the well layer 21. As mentioned above, the well layers 21 are preferably disposed over all of the side surfaces 10$c$ of the semiconductor rod 10. Likewise, the ridge portions 22 are preferably provided at the positions of all of the ridge lines 10$r$. This can achieve the effects exhibited by providing the ridge portions 22 for the well layers 21 disposed over all of the side surfaces 10$c$. It should be noted that the active layer 20 can include a barrier layer (an n-side barrier layer) disposed between the well layer 21 and the semiconductor rod 10 and a barrier layer (a p-side barrier layer) disposed between the well layer 21 and the semiconductor layer 30. Thus, the well layer 21 can be sandwiched between the n-side barrier layer and the p-side barrier layer.

The active layer 20 may have a multiple quantum well structure (a MQW). The active layer 20 shown in FIG. 5 can include a plurality of well layers 21 stacked in the thickness direction of the active layer 20. At this time, a barrier layer 25 is interposed between the adjacent well layers 21. For example, in the case of the active layer 20 covering one side surface 10$c_1$ of the semiconductor rod 10, the well layers 21 and the barrier layers 25 are alternately stacked one upon the other in a direction N perpendicular to the side surface 10$c_1$ (which coincides with the thickness direction of the active layer 20).

The well layers 21 are surrounded by the barrier layers 25 having the wide bandgap and the ridge portions 22 having the wide bandgap, so that carriers can be efficiently confined in the well layers 21.

As the ratio of the length to the thickness (an aspect ratio) of the rod-shaped light emitting portion 5 becomes larger, the light emitting area density thereof can be made higher. The aspect ratio of the rod-shaped light emitting portion 5 can be, for example, 2 or more, or even 5 or more. The rod-shaped light emitting portion 5 can be manufactured stably and easily when its aspect ratio is, for example, 20 or less. The aspect ratio of the rod-shaped light emitting portion 5 is preferably selected in consideration of the density of the rod-shaped light emitting portions 5 per the light emitting element so that the light emitting area becomes large, as compared with the case of a conventional light emitting element having a flat active layer. As used in the present specification, when the cross-sectional shape of an object is a polygon, the term "thickness" refers to the diameter of a circumscribed circle of the polygon.

The first conductivity type semiconductor forming the semiconductor rod 10 and the second conductivity type semiconductor forming the semiconductor layer 30 are semiconductors of different conductivity types. In particular, preferably, the semiconductor rod 10 is formed of a first conductivity type nitride semiconductor, and the semiconductor layer 30 of the second conductivity type is formed of a second conductivity type nitride semiconductor. For example, when the semiconductor rod 10 is formed of an n-type semiconductor (for example, an n-type nitride semiconductor), the semiconductor layer 30 is formed of a p-type semiconductor (for example, a p-type nitride semiconductor). When the semiconductor rod 10 is formed of a p-type semiconductor (for example, a p-type nitride semiconductor), the semiconductor layer 30 is formed of an n-type semiconductor (for example, an n-type nitride semiconductor).

The semiconductor rods 10 can be formed of wurtzite-type crystals. The wurtzite-type crystal, which is a hexagonal crystal, is caused to grow in the vertical direction while suppressing its growth in the lateral direction (an m-axis direction) to form a hexagonal shape in a top view shown in FIG. 1, whereby the rod having a high aspect ratio can be formed. In this case, the side surface 10c of the semiconductor rod 10 (see FIGS. 3A and 4) corresponds to the M-plane of the crystal. In other words, each side surface 10c of the semiconductor rod 10 is the M-plane of the wurtzite-type crystal, and the side surfaces 10c are arranged to form the hexagonal shape in the top view. As used in the present specification, the term "top view" means observation from the z direction as shown in FIGS. 1 and 4.

The semiconductor rods 10 can be formed of GaN crystals. At this time, in the semiconductor rod 10, the direction (the z direction in FIG. 3A) oriented upward from the base layer 40 is preferably the [000-1] direction of the GaN crystal.

FIG. 3B shows a modification of the rod-shaped light emitting portion. A rod-shaped light emitting portion 6 in FIG. 3B has an inclined surface (a facet 16d) between an upper surface 6a and each side surface 6c. The rod-shaped light emitting portion 6 has a semiconductor rod 16 having the facets 16d, an active layer 26 covering the outer surface of the semiconductor rod 16, and a semiconductor layer 36 covering the outer surface of the active layer 26.

As can be seen from FIG. 3A, the semiconductor rod 10 has ridge lines 10e where the side surfaces 10c are in contact with the upper surface 10a. A portion of the active layer 20 covering the semiconductor rod 10, which especially covers the ridge line 10e may be the well layer 21. That is, the active layer 20 may include the continuous well layer 21 from the side surface 10c up to the upper surface 10a of the semiconductor rod 10. However, the semiconductor layer formed on the surface of the semiconductor rod 10 is difficult to have good crystallinity at portions on the ridge lines 10e. That is, if the well layer 21 is also formed in a portion covering the ridge line e, the well layer 21 in that portion tends to have insufficient crystallinity. In this case, the portion with insufficient crystallinity might become a leak path.

Thus, the upper surface 10a side of the semiconductor rod 10 is preferably shaped as shown in FIG. 3B. Also, as can be seen from FIG. 3B, the semiconductor rod 16 has ridge lines 16e where the side surfaces 16c are in contact with the facets 16d, and ridge lines 16f where the facets 16d are in contact with an upper surface 16a. Portions of the active layer 26 covering the semiconductor rod 16, which especially cover the ridge lines 16e and 16f may be the well layer 21. That is, the active layer 26 may include the continuous well layer 21 from the side surface 16c of the semiconductor rod 16 up to the upper surface 16a thereof through the corresponding facet 16d. When the M-plane of the GaN-based crystal is the side surface 16c, an angle formed by the facet 16d and the side surface 16c is preferably approximately 152 degrees. Such a facet 16d is considered to be the (10-11) plane of the GaN-based crystal. It is noted that in Miller indices, a negative integer is written with a bar above a number, whereas in this specification, a negative integer is written with a "-" in front of a number. Because the semiconductor rod 10 has such a facet 16d, the well layer 21 having good crystallinity can be formed at the facet 16d and the ridge line 16e. The upper surface 16a may not be present. That is, in the cross-sectional view shown in FIG. 3B, an upper end portion of the semiconductor rod 10 has a trapezoidal cross-sectional shape, but may have a triangular cross-sectional shape.

Referring again to FIG. 2, in the light emitting element 1, the plurality of rod-shaped light emitting portions 5 are disposed on an upper surface 40b of the base layer 40. More precisely, as shown in FIG. 3A, each semiconductor rod 10 of the rod-shaped light emitting portion 5 is disposed on the upper surface 40b of the base layer 40. Thus, electrical current can flow the semiconductor rods 10 through the base layer 40.

The first light transmissive electrode 81 is formed on a surface of the semiconductor layer 30 of the rod-shaped light emitting portion 5, and the second light transmissive electrode 82 is further formed on a surface of the first light transmissive electrode 81. The semiconductor layers 30 of the plurality of rod-shaped light emitting portions 5 are connected in parallel by the first light transmissive electrode 81. The second light transmissive electrode 82 extends to the upper side of the base layer 40. The second light transmissive electrode 82 and the base layer 40 are electrically insulated from each other by an insulating film 91 disposed therebetween.

Light emitted from the rod-shaped light emitting portions 5 can be extracted to the outside of the light emitting element 1 through the first light transmissive electrode 81 and the second light transmissive electrode 82.

A manufacturing for method a light emitting element 1 will be described below with reference to FIGS. 6A and 6B. A detailed description of a manufacturing process will be given, by way of example, on the manufacturing process of the light emitting element 1 when using a gallium nitride semiconductor as the semiconductor.

In the present disclosure, the well layers 21 included in the active layer 20 are configured to be connected by the ridge portions 22, each of which has a larger bandgap than the well layer 21. The inventors of the present invention have found that the well layers 21 and the ridge portions 22 can be simultaneously formed through one lamination process by adjusting the atmosphere, a source gas, and a formation temperature.

<1. Preparation of Base Layer 40>

Figure 6A:
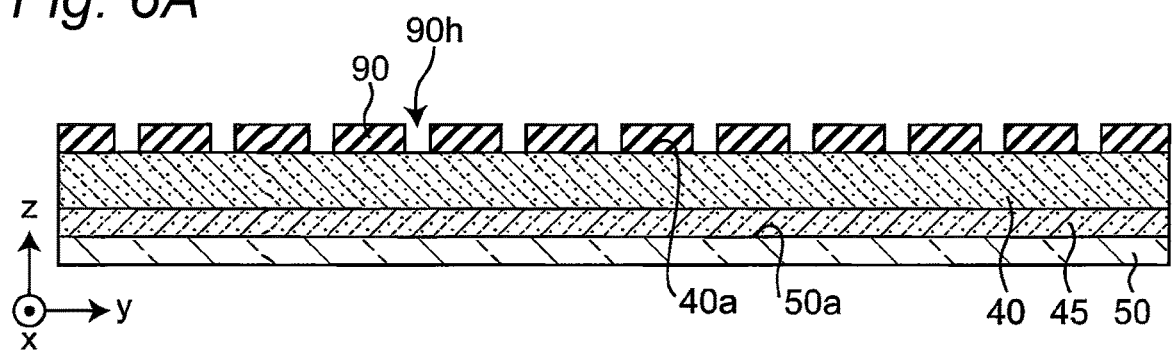
FIGS. 6A to 6D are cross-sectional views for explaining a manufacturing method of the light emitting element according to the present disclosure.

As shown in FIG. 6A, the buffer layer 45 and the base layer 40 are sequentially stacked over the growth substrate 50. As a reactor for forming the buffer layer 45 and the base layer 40, for example, a metal-organic chemical vapor deposition (MOCVD) device can be used. It is noted that the formation of the buffer layer 45 and the base layer 40 may be omitted, and instead, the semiconductor rod 10 may be formed directly on a growth surface of the growth substrate 50.

As the growth substrate 50, a sapphire substrate, a SiC substrate, a nitride semiconductor substrate, or the like can be used as mentioned later. Here, an example of using the sapphire ($Al_2O_3$) substrate will be described. For a sapphire growth substrate 50, the (0001) plane is preferably used as the growth surface. As used herein, the term "(0001) plane" includes a surface slightly inclined with respect to the (0001) plane. Specifically, the growth surface is more preferably a surface that has an off angle of 0.5° or more and 2.0° or less with respect to the (0001) plane.

The growth substrate 50 is preferably pretreated prior to forming the buffer layer 45 on the growth substrate 50. First, the growth substrate 50 is heated in the reactor to apply heat treatment (a thermal cleaning) to a growth surface (an upper surface 50a). The heating temperature is 900 to 1,200° C., and the heating time is approximately 2 to 15 minutes by way of example. By this heat treatment, a crystallographic step appears on the upper surface 50a of the growth substrate 50, and thus the step becomes a formation site of a crystal nucleus.

Thereafter, $NH_3$ gas is introduced into the reactor to nitride the upper surface 50a of the growth substrate 50. The nitriding treatment can be performed, for example, at a treatment temperature of 900 to 1,100° C. and for a treatment time of 1 to 30 minutes. By such nitriding treatment, the surface of a nitride semiconductor grown on the growth substrate can become the (000-1) plane.

The buffer layer 45 is grown on the upper surface 50a of the growth substrate 50 after the nitriding treatment. The temperature of the growth substrate 50 is set to, for example, 550° C., and a source gas is supplied, thereby growing the buffer layer 45 made of GaN. The thickness of the buffer layer 45 is, for example, approximately 20 nm.

Amorphous GaN may be formed as the buffer layer 45 and then subjected to heat treatment. Preferably, the heat treatment temperature is 1,000° C. or higher, the heat treatment time is approximately several minutes to one hour, and the atmosphere during the heat treatment is nitrogen gas or a mixed gas that contains one or both of hydrogen gas and $NH_3$ gas in addition to nitrogen gas.

The base layer 40 is formed on top of the buffer layer 45. The base layer 40 is, for example, a GaN layer. Further, n-type impurities are preferably added to the base layer 40. For example, a GaN layer with Si added thereto is formed as the base layer 40.

The insulating film 90 is formed on an upper surface 40a of the base layer 40. The insulating film 90 is formed of an insulating member, such as $SiO_2$ or SiN. The insulating film 90 has a plurality of through holes 90h penetrating therethrough in the thickness direction (the z direction). The upper surface 40a of the base layer 40 is exposed from the through holes 90h. The through holes 90h can be formed, for example, by a photolithography technique. The through hole 90h can have a shape, such as a circle, an ellipse, or a polygon in the top view (as viewed from the z direction). In particular, the circular through hole 90h is preferable because it is easy to form.

The shortest distance between the adjacent through holes 90h is preferably substantially constant among the through holes 90h. Thus, the semiconductor rods 10 grown from the respective through holes 90h can be arranged at substantially constant intervals. When the active layer 20, the semiconductor layer 30, and the like are grown on the side surfaces of the semiconductor rods 10, the distance between the adjacent semiconductor rods 10 may affect the growth rates of the active layer 20 and the semiconductor layer 30. By arranging the plurality of semiconductor rods 10 at substantially constant intervals, the growth rate of each of the active layer 20, the semiconductor layer 30, and the like formed on each side surface 10c of the semiconductor rods 10 can be made substantially constant on each side surface 10c of the semiconductor rods 10. For example, the through holes 90h are arranged in an equilateral triangular lattice shape in the top view. Furthermore, the direction connecting the centers of the through holes 90h in the top view is preferably the m-axis direction of the GaN-based crystal that constitutes the semiconductor rod 10, i.e., the a-axis direction of sapphire. Thus, as shown in FIG. 1, the semiconductor rods 10, each having a regular hexagonal shape and made of GaN-based crystals, can be arranged in the equilateral triangular lattice shape with the side surfaces 10c of the adjacent semiconductor rods 10 facing each other substantially in parallel. Therefore, the growth rate of each of the active layer 20 and the semiconductor layer 30, formed over each side surface 10c of the respective semiconductor rods 10, can be substantially constant on each side surface 10c of the semiconductor rods 10, so that the thickness of each layer can be substantially the same on each side surface 10c.

<2. Formation of Semiconductor Rod 10>

Figure 6B:
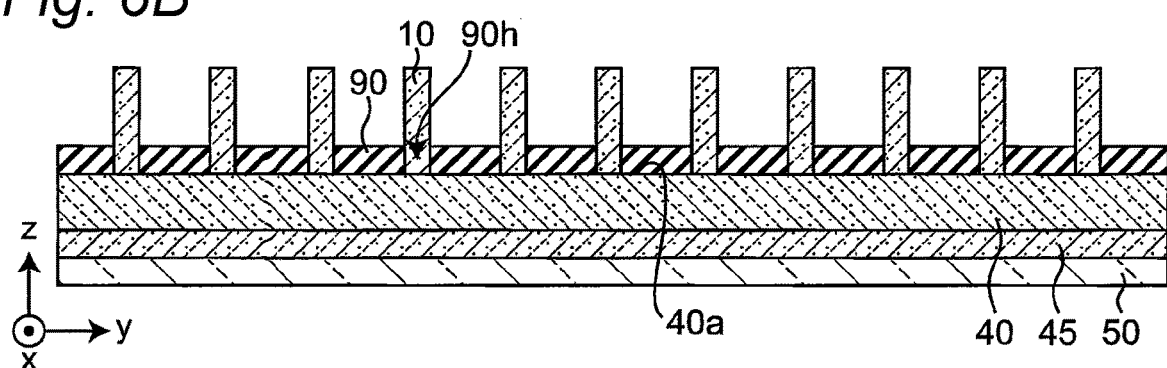

As shown in FIG. 6B, the semiconductor rods 10 are formed on the upper surface 40a of the base layer 40 exposed from the through holes 90h. In forming the semiconductor rods 10 by using the insulating film 90 to function as a mask, the semiconductor rods 10 can be formed to grow upward (in the z direction) from the through holes 90h. At this time, when the nitrided surface of the growth substrate 50 of sapphire is used as the growth surface, the growth direction of the grown GaN-based crystal becomes the [000-1] direction. Thus, the growth direction of the semiconductor rod 10 also becomes the [000-1] direction of the GaN-based crystal. That is, the direction (the z direction) oriented upward from the base layer 40 of the semiconductor rod 10 is the [000-1] direction of the GaN-based crystal.

When the growth direction of the GaN-based semiconductor is set to the [000-1] direction, migration of the GaN-based semiconductor is suppressed, making it less likely to cause the growth of the GaN-based semiconductor in the lateral direction. Thus, the semiconductor rod 10 grows upwardly (in the z direction) while substantially maintaining its thickness acquired at the beginning of the growth within the corresponding through hole 90h of the insulating film 90. Consequently, the semiconductor rod 10 having a relatively uniform thickness can be obtained.

When the semiconductor rods 10 are formed of wurtzite-type (hexagonal) GaN-based crystals, such semiconductor rods 10 tend to grow into a hexagonal columnar shape. Thus, even if the through hole 90h in the insulating film 90 has a circular shape, the semiconductor rod 10 is formed not in a cylindrical shape, but in a hexagonal columnar shape. At this time, the side surface of the semiconductor rod 10 becomes the M-plane of the GaN-based crystal. If the inner diameter of the through hole 90h is large, the thickness of the semiconductor rod 10 also increases accordingly. Therefore, the thickness of the semiconductor rod 10 can be controlled by the inner diameter of the through hole 90h.

The semiconductor rod 10 is caused to grow by supplying a source gas with the temperature of the growth substrate 50 set to, for example, 900 to 1,100° C. The semiconductor rods 10 are formed of, for example, GaN crystals. In this case, like the base layer 40, a mixed gas that contains trimethylglycine (TMG) or triethylene glycol (TEG) as a gallium source and $NH_3$ as a nitrogen source can be used as the source gas. N-type impurities are preferably added to the semiconductor rod 10 as well. For example, silane gas is added to the above-mentioned source gas to form a GaN crystal with Si added thereto as the semiconductor rod 10. The length (dimension in the z direction) of the semiconductor rod 10 can be controlled by the supply time of the source gas. By setting the supply time of the source gas to, for example, 20 to 60 minutes, the semiconductor rod 10 can be formed to have a length of approximately 5 to 15 μm.

The semiconductor rod 16 having the facets, such as those shown in FIG. 3B, can be formed by appropriately adjusting conditions for forming the semiconductor rod 10 (the growth temperature, the flow rate of the source gas, the inner diameter of the through hole 90h, and the like).

<3. Formation of Active Layer 20>

Figure 6C:
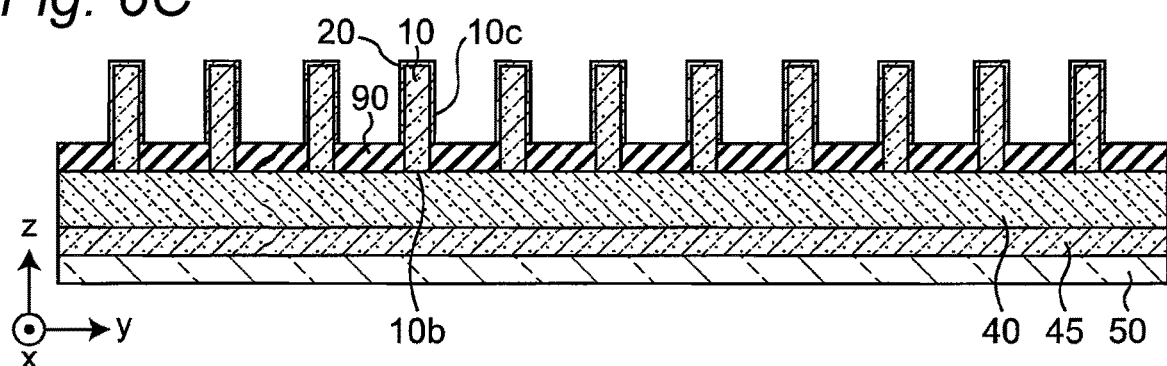

As shown in FIG. 6C, the active layer 20 is formed on the outer surface of the semiconductor rod 10.

For example, in the case of emitting blue light from the rod-shaped light emitting portion 5, the active layer 20 is formed by supplying a source gas with a temperature of the growth substrate 50 set to approximately 800 to 900° C. A mixed gas that contains TMG or TEG as a gallium source, $NH_3$ as a nitrogen source, and trimethylindium (TMI) as an indium source can be used as the source gas. Here, the ratio of a nitrogen element to a gallium element in the source gas is preferably set at $5.5 \times 10^3$ to $2.2 \times 10^5$. When the ratio of the nitrogen element to the gallium element is within this range, an InGaN film that constitutes the well layer 21 of the active layer 20 (see FIGS. 4 and 5) can be well formed. It is noted that if the ratio falls below the above-mentioned range, In generated from the indium source is less likely to bond with Ga or N and more likely to be precipitated as In metal. If the ratio exceeds the above range, In generated from the indium source is more likely to be discharged from the source gas by H generated from $NH_3$ as the nitrogen source, making it less likely to form InGaN.

The ratio of the nitrogen element to the gallium element in the source gas is more preferably $2.2 \times 10^4$ to $2.2 \times 10^5$, and particularly preferably $4.4 \times 10^4$ to $1.1 \times 10^5$.

It should be noted that the mixed gas may contain $H_2$ gas or $N_2$ gas as a carrier gas. In the case of growing InGaN, $N_2$ gas is preferably used as the carrier gas because InGaN is less likely to grow if $H_2$ gas is used as the carrier gas.

The above-mentioned formation conditions are set so that a portion of the active layer formed on the side surface 10c of the semiconductor rod 10 has a large In composition ratio to become the well layer 21, whereas a portion of the active layer formed on the ridge line 10r of the semiconductor rod 10 has a smaller In composition ratio to become the ridge portion 22. Specifically, the ratio of the gallium element and the nitrogen element contained in the source gas or the like is preferably adjusted. For example, one of these conditions is varied to form the active layer 20, and then the respective In composition ratios of the obtained well layers 21 and the like are checked, whereby suitable conditions can be found.

The reason that the In composition ratio of the ridge portion 22 selectively decreases is not clear. However, when comparing InGaN formed on the side surface 10c of the semiconductor rod 10 and InGaN formed on the ridge portion 22, it is considered that under the above-mentioned formation conditions, In tends to be selectively discharged from the InGaN on the ridge portion 22. In more detail, it is also considered that the InGaN crystal grown on the ridge line 10r is unstable, thereby enabling the formation of the ridge portion 22. That is, it is presumed that the growth of the unstable InGaN crystal on the ridge line 10r leads to discharge of In having a relatively low bond energy from InGaN, resulting in the formation of the ridge portion 22 that has a low In composition ratio.

Figure 5:
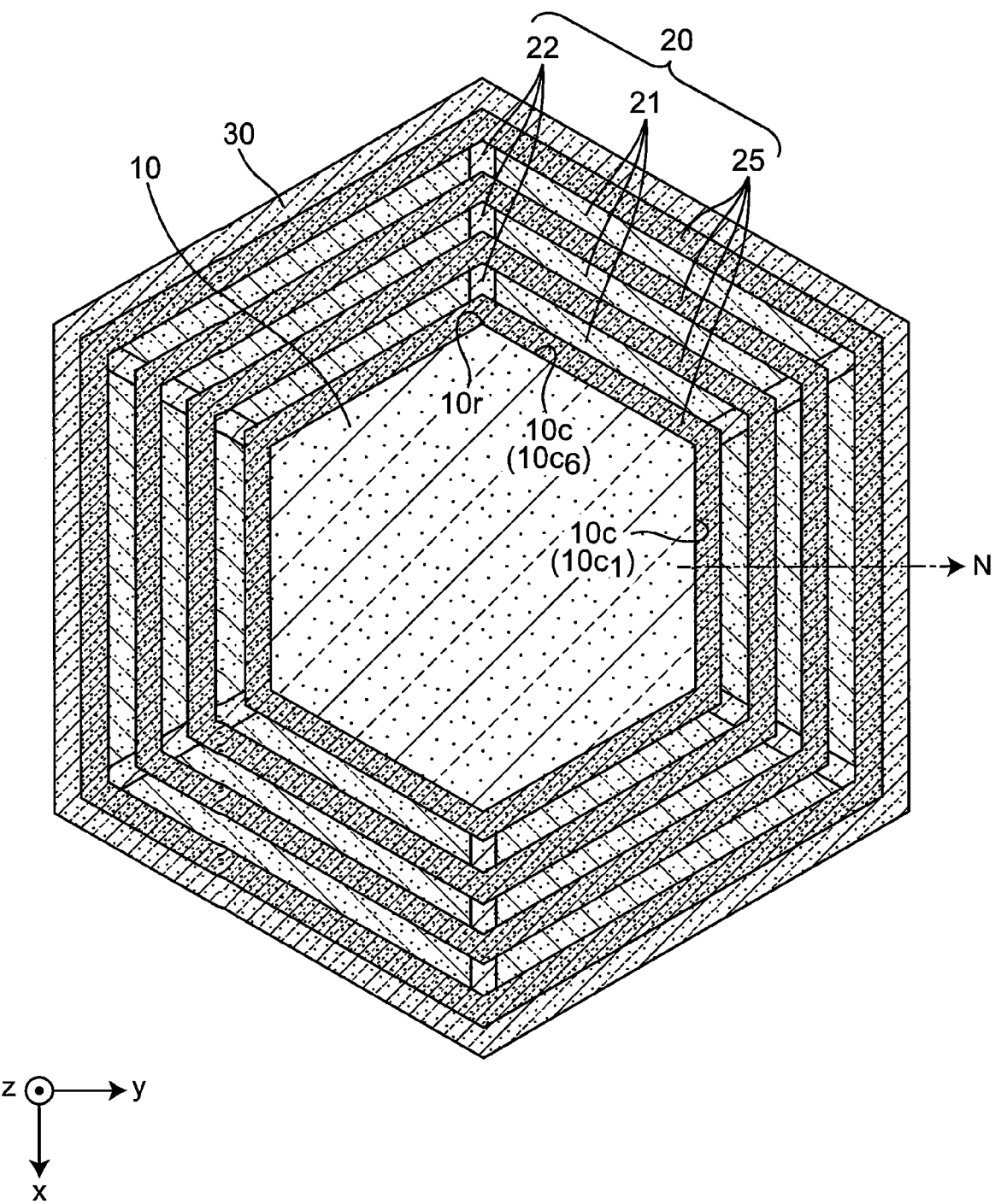
FIG. 5 is an exemplary cross-sectional view showing a modified example of the rod-shaped light emitting portion.

The well layer 21 and the ridge portion 22 can be easily distinguished from each other by a transmission electron microscope (TEM) image of the cross section of the rod-shaped light emitting portion 5 (see FIGS. 4 and 5). In a TEM photograph of a bright-field image, the well layer 21 having a high In composition ratio is colored in dark gray or black, whereas the ridge portion 22 having a low In composition ratio is colored in light gray or white.

A width 22w of the ridge portion 22 is the size of one atom or more, and can be, for example, 2 nm or less. It is noted that the term width of the ridge portion 22 as used herein refers to the shortest distance between the two well layers 21 that sandwich the ridge portion 22 therebetween.

As can be seen from FIG. 6C, a part of each side surface 10c of the semiconductor rod 10 located on the lower surface 10b side is covered with the insulating film 90. Thus, the active layer 20 is not formed in that part. In other words, only the outer surface of the semiconductor rod 10 exposed upward from the insulating film 90 can be covered with the active layer 20.

<4. Formation of Semiconductor Layer 30>

Figure 6D:
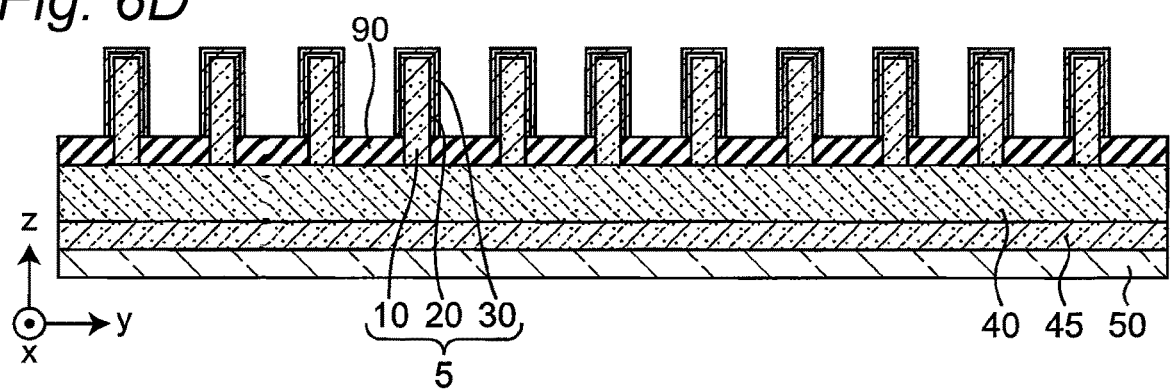

As shown in FIG. 6D, the semiconductor layer 30 is formed on the outer surface of the active layer 20. When the semiconductor rod 10 is formed of an n-type GaN-based crystal (an n-type nitride semiconductor), the semiconductor layer 30 is formed of a p-type GaN-based crystal (a p-type nitride semiconductor). For example, the semiconductor layer 30 is formed by stacking a plurality of p-type GaN layers and/or p-type AlGaN layers while varying p-type impurity concentrations of the p-type layers.

The semiconductor layer 30 is formed by supplying a source gas with the temperature of the growth substrate 50 set to, for example, 800 to 900° C. A mixed gas that contains TMG or TEG as a gallium source and $NH_3$ as a nitrogen source can be used as the source gas. Further, in order to add p-type impurities, for example, $Cp_2Mg$ (biscyclopentadienyl magnesium) is added to the source gas, so that the GaN layer with Mg added thereto is formed as the semiconductor layer 30. By setting the supply time of the source gas to, for example, 20 to 60 minutes, the semiconductor layer 30 can be formed to have a thickness of approximately 40 to 120 nm.

The formation of the semiconductor layer 30 can produce the rod-shaped light emitting portion 5.

<5. Formation of Light-Transmissive Electrodes 71 and 81>

Figure 6E:
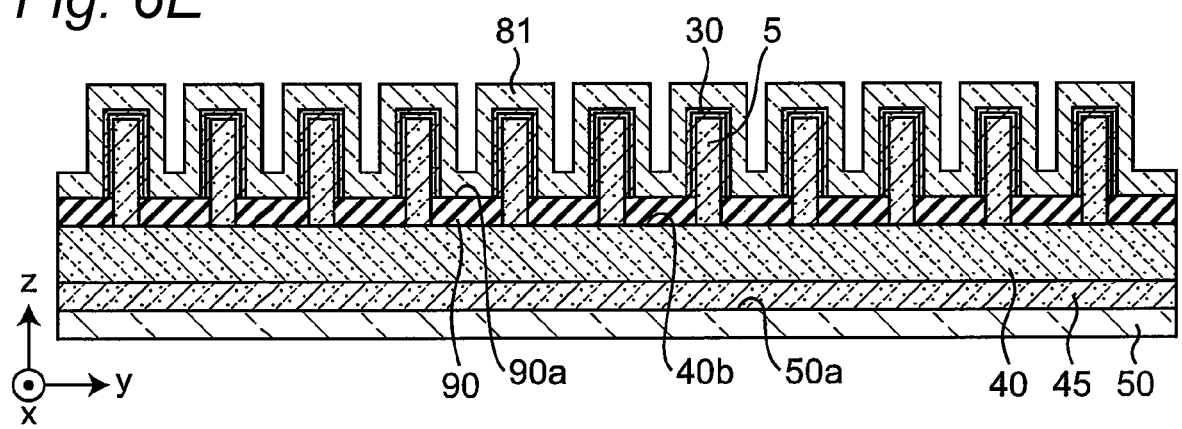
FIGS. 6E and 6F are cross-sectional views for explaining the manufacturing method of the light emitting element according to the present disclosure.

As shown in FIG. 6E, the first light transmissive electrode 81 is formed so as to continuously cover the outer surfaces of the semiconductor layers 30 of the rod-shaped light emitting portions 5 and an upper surface 90a of the insulating film 90.

Figure 6F:
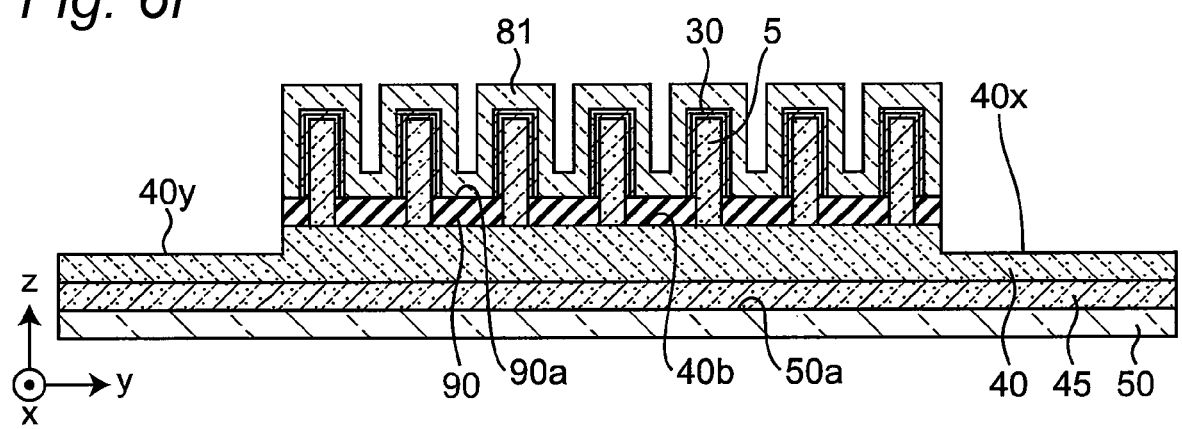

Then, as shown in FIG. 6F, portions of the first light transmissive electrode 81 and portions of the plurality of rod-shaped light emitting portions 5 are removed to expose portions of the base layer 40 from the insulating film 90. The portions of the base layer 40 exposed from the insulating film 90 will be hereinafter referred to as a first exposed portion 40x and a second exposed portion 40y. It is noted that an electrode for passing electrical current to the semiconductor rods 10 is formed on the first exposed portion 40x. Another electrode for passing electrical current to the semiconductor layer 30 is formed on the upper side of the second exposed portion 40y via the insulating film 91. The respective electrodes will be described in detail below.

In this way, by forming the first exposed portion 40x and the second exposed portion 40y after the formation of the first light transmissive electrode 81, the rod-shaped light emitting portions 5 can be protected from a removal solution, which is used to remove an etching mask for forming the first exposed portion 40x and the second exposed portion 40y. That is, the rod-shaped light emitting portions 5 are covered with the first light transmissive electrode 81, thus making it difficult for the removal solution to come into contact with the rod-shaped light emitting portions 5. Therefore, the possibility that the necessary rod-shaped light emitting portions 5 are removed can be reduced.

In any region where the first exposed portion 40x or the second exposed portion 40y is formed, the rod-shaped light emitting portion 5 may not be grown in advance, in other words, the through hole 90h may not be formed at the insulating film 90. On the other hand, without setting the formation positions of the first exposed portion 40x and the second exposed portion 40y in advance, the formation positions of the first exposed portion 40x and the second exposed portion 40y may be determined after confirming the presence or absence of any defect in the formed rod-shaped light emitting portions 5. Thus, the first exposed portion 40x and the second exposed portion 40y can be formed at respective positions of the rod-shaped light emitting portions 5 that have defects, such as insufficient growing.

The light transmissive electrode 81 can be formed of, for example, a light transmissive conductive film, such as an indium tin oxide (ITO) film.

<6. Formation of Insulating Film 91>

Figure 6G:
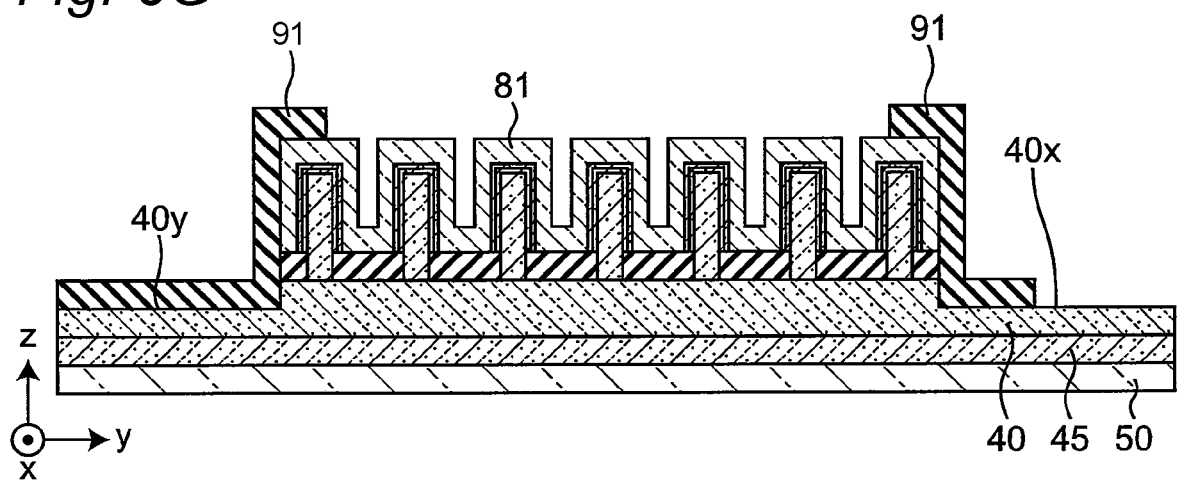
FIGS. 6G and 6H are cross-sectional views for explaining the manufacturing method of the light emitting element according to the present disclosure.

As shown in FIG. 6G, the insulating film 91 is formed to cover parts of the first light transmissive electrode 81, a part of the first exposed portion 40x of the base layer 40 (a portion where the n-side light transmissive electrode 71 is not formed), and the entire second exposed portion 40y of the base layer 40.

The insulating film 91 is formed of an insulating material, such as $SiO_2$ or SiN. Due to its light transmissive property, $SiO_2$ has the advantage of being capable of extracting light emitted from the rod-shaped light emitting portions 5 through the insulating film 91.

<7. Formation of Light-Transmissive Electrodes 71 and 82 and Pad Electrodes 70 and 80>

Figure 6H:
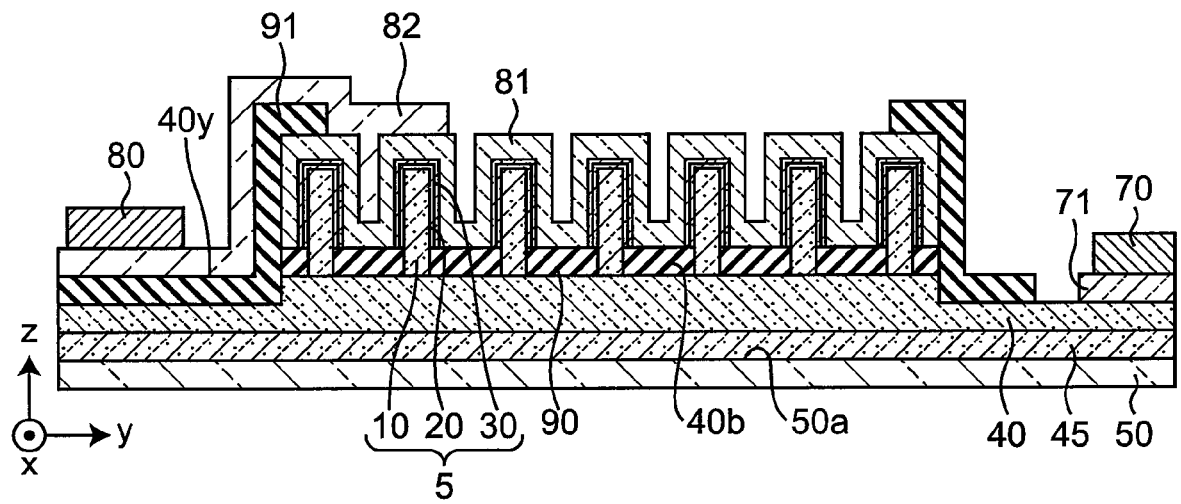

As shown in FIG. 6H, an n-side light transmissive electrode 71 and a second light transmissive electrode 82 are formed. The n-side light transmissive electrode 71 is formed on the first exposed portion 40x of the base layer 40. The second light transmissive electrode 82 is in contact with the first light transmissive electrode 81 and extends to the upper side of the second exposed portion 40y of the base layer 40. The insulating film 91 is disposed between the second light transmissive electrode 82 and the second exposed portion 40y of the base layer 40, thereby preventing short circuit therebetween.

Then, the n-side pad electrode 70 is formed on the n-side light transmissive electrode 71. Furthermore, the p-side pad electrode 80 is formed on the second light transmissive electrode 82 directly above the second exposed portion 40y of the base layer 40.

The p-side pad electrode 80 and the rod-shaped light emitting portions 5 are brought into conduction via the second light transmissive electrode 82 and the first light transmissive electrode 81. The n-side pad electrode 70 and the rod-shaped light emitting portions 5 are also brought into conduction via the n-side light transmissive electrode 71 and the base layer 40.

In a p-side current path, the first light transmissive electrode 81 is in contact with the semiconductor layers 30 of the plurality of rod-shaped light emitting portions 5, whereas in an n-side current path, the base layer 40 is in contact with the semiconductor rods 10 of the plurality of rod-shaped light emitting portions 5. That is, the plurality of rod-shaped light emitting portions 5 are connected in parallel.

Each component of the light emitting element 1 in the present disclosure will be described below. The light emitting element 1 of the present disclosure is a so-called semiconductor light emitting element, and examples of the light emitting element 1 includes a light emitting diode (a LED) and a laser diode (a LD).

(Rod-Shaped Light-Emitting Portion 5)

The rod-shaped light emitting portion 5 has a polygonal columnar outer shape or a polygonal columnar outer shape having facets at its upper end.

The rod-shaped light emitting portion 5 can be formed of a semiconductor material, such as a group III-V compound semiconductor or a group II-VI compound semiconductor. Specifically, nitride semiconductors, such as $In_xAl_yGa_{1-x-y}N$ (0≤X, 0≤Y, X+Y≤1), for example, InN, AlN, GaN, InGaN, AlGaN, InGaAlN, etc., can be used.

Semiconductors suitable for each component of the rod-shaped light emitting portion 5 (the semiconductor rod 10, the active layer 20, and the semiconductor layer 30) will be described in detail.

The semiconductor rod 10 includes the first conductivity type semiconductor (for example, an n-type semiconductor). Examples of the semiconductor suitable for the semiconductor rods 10 include GaN and AlGaN. It is noted that Si, Ge, O, or the like may be added as an n-type impurity. The semiconductor rod 10 may be composed of only the first conductivity type semiconductor material.

The active layer 20 includes the ridge portions 22, each having a large bandgap, and the well layers 21, each having a small bandgap. An example of the semiconductor suitable for the well layer 21 is $In_xGa_{1-x}N$. Examples of semiconductors suitable for the ridge portion 22 include GaN and $In_yGa_{1-y}N$. It should be noted that when both the well layer 21 and the ridge portion 22 are formed of InGaN, the In composition ratio of the well layer 21 is set larger than the In composition ratio of the ridge portion 22 (i.e., x>y).

The semiconductor layer 30 includes the second conductivity type semiconductor (for example, a p-type semiconductor). An example of the semiconductor suitable for the semiconductor layer 30 is GaN that contains p-type impurities, such as Mg. The semiconductor layer 30 may have a multilayer structure that includes a layer of a p-type semiconductor containing p-type impurities and an undoped layer.

(Light-Transmissive Electrodes 71, 81, 82)

The n-side light transmissive electrode 71, the first light transmissive electrode 81, and the second light transmissive electrode 82 can be formed of light transmissive conductive material, and particularly, a conductive oxide is suitable as the light transmissive conductive material. Examples of the conductive oxide include ZnO, $In_2O_3$, ITO, $SnO_2$, and MgO. In particular, ITO is preferable because of its high conductivity and high light transmittance invisible light (a visible region).

In this way, two layers, namely, the first light transmissive electrode 81 and the second light transmissive electrode 82, are preferably provided as the p-side light transmissive electrode. The p-side light transmissive electrode can be formed by only one layer. However, in this case, as the p-side light transmissive electrode is forcedly provided after forming the insulating film 91, the parts of the rod-shaped light emitting portions 5 covered with the insulating film 91 cannot be energized, thus decreasing the light emitting area. If the formation area of the insulating film 91 is decreased by forming the insulating film 91 not to cover the rod-shaped light emitting portions 5, the p-side electrode and the base layer 40 are more likely to be short-circuited therebetween. When the p-side light transmissive electrode has a double-layered structure composed of the first light transmissive electrode 81 and the second light transmissive electrode 82, the insulating film 91 can be formed up to the top of the rod-shaped light emitting portions 5 to the extent that the possibility of short circuit is low, and additionally, even the rod-shaped light emitting portions 5 located under the insulating film 91 can be energized. It is noted that a portion where the second light transmissive electrode 82 overlaps the first light transmissive electrode 81 has a lower light transmittance than a portion where only the first light transmissive electrode 81 is formed over the rod-shaped light emitting portion with no second light transmissive electrode 82 thereover. Therefore, the surface area of the portion where the first light transmissive electrode 81 is exposed from the second light transmissive electrode 82 is preferably set larger than the surface area of the portion where the first light transmissive electrode 81 and the second light transmissive electrode 82 overlap each other. Thus, the extraction efficiency of light emitted from the rod-shaped light emitting portion 5 can be improved.

It is noted that the n-side light transmissive electrode 71 may be omitted. In this case, the n-side pad electrode 70 is formed directly on the base layer 40.

(Growth Substrate 50)

The growth substrate 50 for growing a nitride semiconductor typically uses an insulating substrate made of sapphire ($Al_2O_3$) or the like. Alternatively, a nitride semiconductor (GaN, AlN, etc.) can also be used as the growth substrate.

In particular, the growth substrate is preferably a sapphire growth substrate that has the C-plane, i.e., (0001) plane as a growth surface. The growth surface preferably has an off angle of 0.5° to 2.0° with respect to the (0001) plane rather than is strictly coincident with the (0001) plane. By nitriding such a surface, a GaN-based semiconductor can be grown in the [000-1] direction.

(Insulating Films 90 and 91)

The insulating films 90 and 91 can be formed of, for example, silicon dioxide ($SiO_2$) or SiN.

(Pad Electrodes 70 and 80)

An electrical good conductor can be used in the n-side pad electrode 70 and the p-side pad electrode 80. Suitable material for these electrodes is metal, such as Cu, Au, Ag, Ni, or Sn. When forming the pad electrodes 70 and 80 above the light transmissive electrodes 71 and 81, respectively, the pad electrodes 70 and 80 are preferably formed of conductive material that can be in ohmic contact with the light transmissive electrodes. It should be noted that the p-side pad electrode 80 may be provided directly on the rod-shaped light emitting portion 5, and in that case, the p-side light transmissive electrode may be formed by only one layer (only the first light transmissive electrode 81). Preferably, instead of providing the p-side pad electrode 80 directly on the rod-shaped light emitting portion 5, as shown in FIG. 2, a region where the rod-shaped light emitting portion 5 is not present is provided, and then the p-side pad electrode 80 is formed in the region. Consequently, the light from the rod-shaped light emitting portions 5 can be extracted to the outside without being blocked by the p-side pad electrode 80, thus improving the light extraction efficiency of the light emitting element 1.

Experimental Examples

The semiconductor rods 10 and the active layer 20 according to the present disclosure were manufactured. The active layer 20 was formed to have a multi-quantum-well structure (MQW), and the respective semiconductor layers were formed by the MOCVD method.

First, a sapphire substrate having a surface offset from the (0001) plane by approximately 1° as the growth surface was prepared as the growth substrate 50. The upper surface 50a of the growth substrate 50 was nitrided such that an upper surface of the nitride semiconductor to be grown on the upper surface 50a (a plane parallel to the upper surface 50a of the growth substrate 50) became the (000-1) plane. Subsequently, the insulating film 90 of $SiO_2$ (having a thickness of approximately 0.3 μm) was formed on the growth substrate 50 by photolithography so as to have the plurality of through holes 90h, each having a circular opening with a diameter of 2 μm.

Then, the buffer layer 45 of GaN (having a thickness of approximately 20 nm) was formed on the growth substrate 50 with the insulating film 90 formed thereon, followed by heat treatment. Here, because the base layer 40 was not provided, the buffer layer 45 was formed in this way after the formation of the insulating film 90.

Next, the semiconductor rods 10 made of GaN were formed on the following formation conditions, thereby producing a plurality of semiconductor rods 10, each having a substantially hexagonal columnar shape with a thickness of approximately 3 μm and a length of approximately 10 μm.

Substrate temperature: 1,045° C.
Manufacturing time: 40 minutes
Atmospheric gas: a mixed atmosphere of hydrogen and nitrogen
Carrier gas: 11 slm of nitrogen
$NH_3$: 50 sccm (approximately $2 \times 10^{-3}$ mol/min)
TMG: 20 sccm (approximately $65 \times 10^{-6}$ mol/min)

After forming the semiconductor rods 10, the active layer 20 was formed by changing the formation conditions thereof in the following way. The active layer 20 was formed by alternately stacking the barrier layer 25 and a layer including the well layers 21 and the ridge portions 22 (herein referred to as "mixed layer") from the semiconductor rod 10 side. After forming the six barrier layers 25 and the six mixed layers, finally, another barrier layer 25 was formed thereon. The respective conditions for forming the barrier layer 25 and the mixed layer were as follows. The conditions for forming the barrier layer 25 were designed for GaN, whereas the conditions for forming the mixed layer were designed for InGaN.

[Conditions for Forming Barrier Layer 25]
Substrate temperature: 810° C.
Atmospheric gas: Nitrogen
Carrier gas: 8 slm of nitrogen
$NH_3$: 4 slm (approximately $2 \times 10^{-1}$ mol/min)
TEG: 16 sccm (approximately $4 \times 10^{-6}$ mol/min)

Only the first layer among the barrier layers 25 (the layer in contact with the semiconductor rod 10), which was made of GaN, was doped with Si. When forming the first barrier layer 25, $SiH_4$ gas was added as a Si dopant source at $8 \times 10^{-9}$ mol/min to the above-mentioned source gas. The formation times of the barrier layers 25 were set to approximately 9 minutes for the first barrier layer (having a thickness of approximately 10 nm), and 4 minutes for each of the second to seventh barrier layers (each layer having a thickness of approximately 4 to 10 nm).

[Conditions for Forming Mixed Layer (Well Layer 21, Ridge Portion 22)]
Substrate temperature: 810° C.
Atmospheric gas: Nitrogen
Carrier gas: 8 slm of nitrogen
$NH_3$: 4 slm (approximately $2 \times 10^{-1}$ mol/min)
TEG: 16 sccm (approximately $4 \times 10^{-6}$ mol/min)
TMI: 142 sccm (approximately $12 \times 10^{-6}$ mol/min)

The formation times of the mixed layers were set to approximately 4 minutes for each of all of the first to sixth mixed layers (each layer having a thickness of approximately 4 to 10 nm). It is noted that the second to seventh barrier layers 25 and the mixed layers had the same growth time, but had a difference in the growth rate along the length direction of the semiconductor rod 10. Due to this, as shown in a TEM image mentioned later, the barrier layer 25 and the mixed layer do not necessarily have the same thickness.

Figure 7:
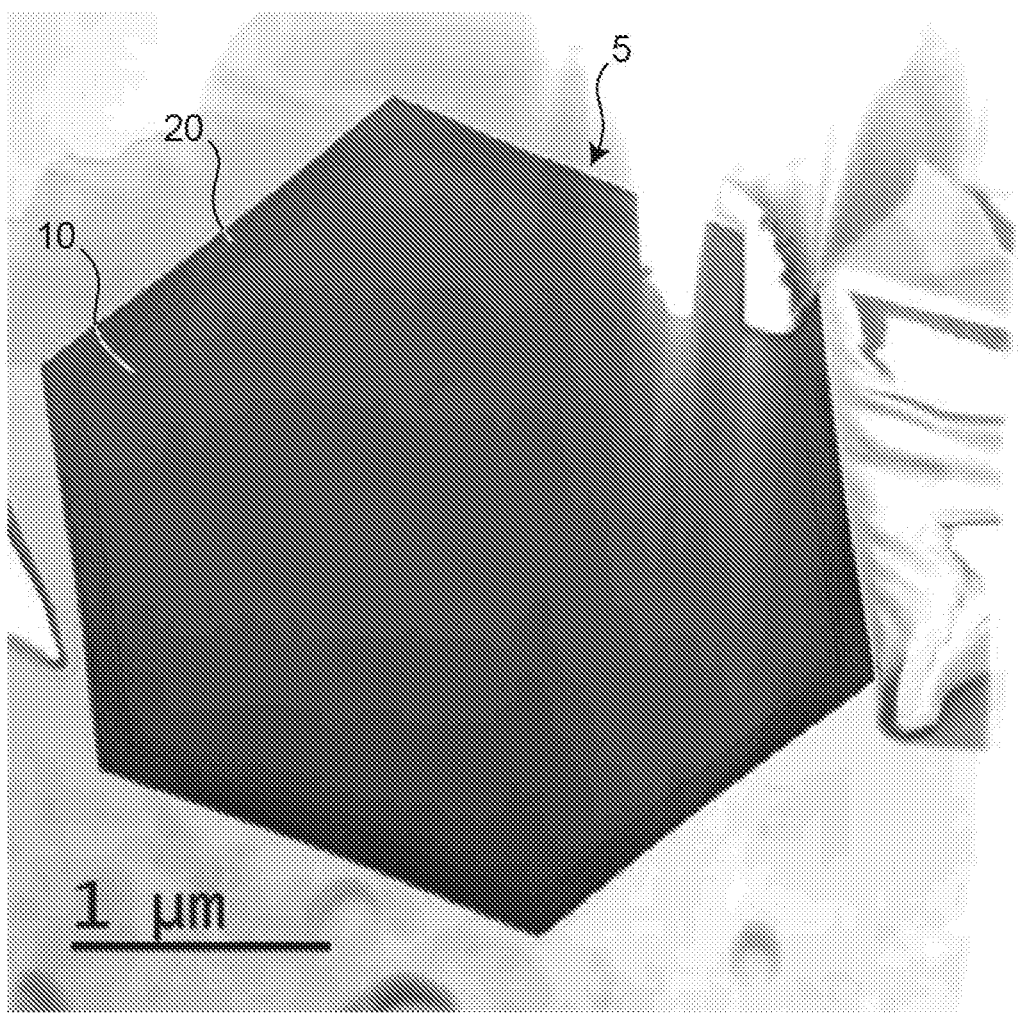
FIG. 7 is a transmission electron microscopy (TEM) image of a cross section of a rod-shaped light emitting portion manufactured in an experimental example.
Figure 8:
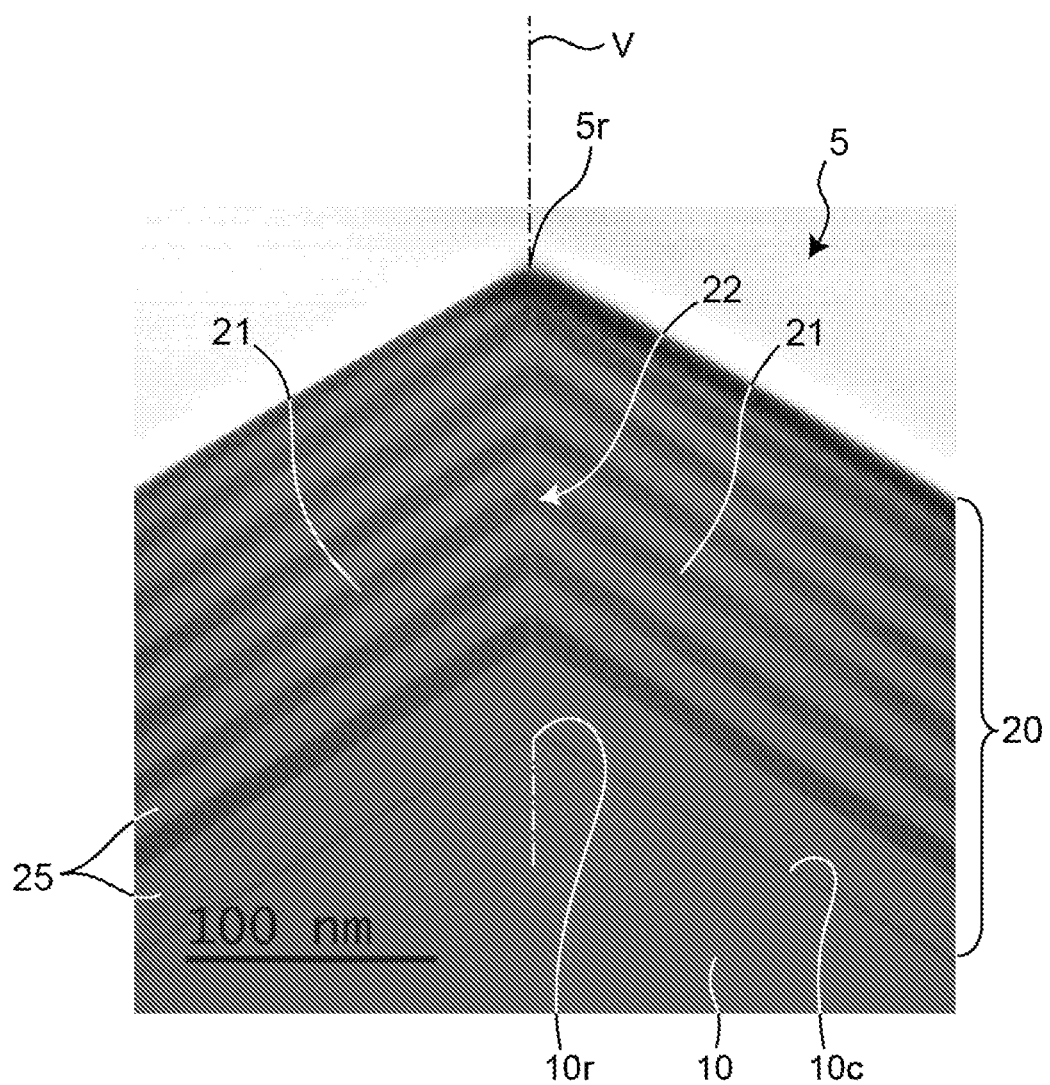
FIG. 8 is a TEM image of the cross section of the rod-shaped light emitting portion manufactured in the experimental example.

The cross section of the thus-obtained rod-shaped light emitting portion 5 was observed with the TEM. FIG. 7 is a TEM image of the entire cross section of the rod-shaped light emitting portion 5, and FIG. 8 is a TEM image of apart of the cross section of the rod-shaped light emitting portion 5. From the TEM image of FIG. 8, the side surfaces 10c and the ridge line 10r of the semiconductor rod 10, as well as the well layers 21, the ridge portions 22, and the barrier layers 25 of the active layer 20 can be confirmed.

In the TEM image of FIG. 8, the active layer 20 can be observed to include the barrier layers 25, the well layers 21, and the ridge portions 22. Each well layer 21 extends in the direction parallel to the side surface 10c of the semiconductor rod 10. The well layer 21 (dark gray part) has an extending direction thereof changed at a position of aline (imaginary line v) that connects the ridge line 10r of the semiconductor rod 10 and the ridge line 5r of the rod-shaped light emitting portion 5. The ridge portion 22 (linear thin gray part) is located at a bent part of the well layer 21 and thereby separates the well layers 21, located on both sides of the ridge portion 22. It is noted that the layer grown at the outermost periphery, shown in the TEM image of FIG. 8, is a GaN barrier layer (the seventh layer). A part of the outermost peripheral portion is colored in dark gray, but this is supposed to be because the growth of the layer was terminated here intentionally.

Regarding all of the six well layers 21 stacked in the thickness direction of the active layer 20, it is found that the adjacent well layers 21 were separated by the ridge portion 22 arranged along the imaginary line v.

DESCRIPTION OF REFERENCE NUMERALS

1 Light emitting element
5, 6 Rod-shaped light emitting portion
10, 16 First conductivity type semiconductor rod (semiconductor rod)
10c, 16c Side surface of semiconductor rod
20, 26 Active layer
21 Well layer
22 Ridge portion
25 Barrier layer
30, 36 Second conductivity type semiconductor layer (semiconductor layer)
40 Base layer
45 Buffer layer
50 Growth substrate
90, 91 Insulating film
90h Through hole

The invention claimed is:

1. A light emitting element comprising:
a first conductivity type semiconductor rod having a plurality of side surfaces arranged to form a polygonal column shape;
an active layer formed of a semiconductor and covering the side surfaces of the first conductivity type semiconductor rod; and
a second conductive type semiconductor layer covering the active layer, wherein:
the active layer comprises a plurality of well layers respectively disposed over at least two adjacent side surfaces among the plurality of side surfaces of the first conductivity type semiconductor rod,
adjacent well layers among the plurality of well layers are separated from each other along a ridge line where the at least two adjacent side surfaces are in contact with each other,
the active layer further comprises a ridge portion formed of a semiconductor and disposed on the ridge line, the ridge portion connecting the adjacent well layers, and
a bandgap of the ridge portion is wider than a bandgap of each of the plurality of well layers.

2. The light emitting element according to claim 1, wherein:
the plurality of well layers are respectively disposed over all of the side surfaces of the first conductivity type semiconductor rod, and
all of the adjacent well layers among the plurality of well layers are connected by the respective ridge portions.

3. The light emitting element according to claim 1, wherein:
the well layers are stacked with a barrier layer interposed therebetween, in a direction perpendicular to the respective side surfaces of the first conductivity type semiconductor rod.

4. The light emitting element according to claim 1, wherein:
the plurality of well layers are formed of a nitride semiconductor containing In, and
an In composition ratio of the ridge portion is lower than an In composition ratio of the well layer.

5. The light emitting element according to claim 1, wherein:
the ridge portion is formed of GaN, and the plurality of well layers are formed of InGaN.

6. The light emitting element according to claim 1, wherein:
the first conductivity type semiconductor rod is a first conductivity type nitride semiconductor rod containing a first conductivity type nitride semiconductor,
the second conductivity type semiconductor layer is a second conductivity type nitride semiconductor layer containing a second conductivity type nitride semiconductor,
the first conductivity type nitride semiconductor rod is disposed on an upper surface of a base layer and formed of a wurtzite-type crystal, and
the side surfaces of the first conductivity type semiconductor rod are arranged in a hexagonal shape in a top view, each of the side surfaces being a M-plane of the crystal.

7. The light emitting element according to claim 6, wherein:
the first conductivity type semiconductor rod is formed of a GaN crystal.

8. The light emitting element according to claim 7, wherein:
in the first conductivity type nitride semiconductor rod, a direction oriented upward from the base layer is a [000-1] direction of the GaN crystal.

9. The light emitting element according to claim 1, wherein, the first conductivity type semiconductor rod has an inclined surface between an upper surface and a side surface thereof in a cross-sectional view.

10. The light emitting element according to claim 1, wherein, the semiconductor rod has an aspect ratio of 2 to 20 in a cross-sectional view.

11. The light emitting element according to claim 1, further comprising:
- an additional first conductivity type semiconductor rod;
- an additional active layer; and
- an additional second conductivity type semiconductor layer,
- wherein the second conductive type semiconductor layer and the additional second conductivity type semiconductor layer are connected to each other in parallel by being covered with a first light transmissive electrode.

12. The light emitting element according to claim 11, further comprising,
- a base layer having an upper surface and a lower surface;
- an insulating film; and
- a second light transmissive electrode, wherein:
- the first conductive semiconductor is arranged on the upper surface of the base layer,
- the second light transmissive electrode extends from the surface of the first light transmissive electrode to the upper surface of the base layer, and
- the insulating film is arranged between the second light transmissive electrode and the base layer.

13. The light emitting element according to claim 12, further comprising a growth substrate formed on the lower surface of the base layer.

14. The light emitting element according to claim 13, wherein the growth substrate is a sapphire substrate, a SiC substrate, or a nitride semiconductor substrate.

15. The light emitting element according to claim 13, wherein the growth substrate has a growth surfaces having an off angle of 0.5° or more and 2.0° or less with respect to a (0001) plane of the sapphire substrate.

16. The light emitting element according to claim 11, wherein the first light transmissive electrode contains ZnO, $In_2O_3$, ITO, $SnO_2$, and/or MgO.

* * * * *